United States Patent [19]

Botez

[11] Patent Number: 4,852,113

[45] Date of Patent: Jul. 25, 1989

[54] LASER ARRAY WITH WIDE-WAVEGUIDE COUPLING REGION

[75] Inventor: Dan Botez, Redondo Beach, Calif.

[73] Assignee: TRW Inc., Redondo Beach, Calif.

[21] Appl. No.: 921,648

[22] Filed: Oct. 21, 1986

[51] Int. Cl.$^4$ .............................................. H01S 3/19
[52] U.S. Cl. ...................................... 372/50; 372/46; 372/48
[58] Field of Search ....................... 372/50, 19, 44, 45, 372/46, 48

[56]     References Cited
        U.S. PATENT DOCUMENTS

| Re. 31,806 | 1/1985 | Scifres et al. ........................... | 372/50 |
| 4,723,252 | 2/1988 | Botez et al. ............................ | 372/48 |
| 4,772,082 | 9/1988 | Matsui et al. .......................... | 372/50 |

OTHER PUBLICATIONS

Kuo-Liang Chen & Shyh Wang, "Single-Lobe Symmetric Coupled Laser Arrays," Electron. Lett., vol. 21, No. 8, pp. 347-349, 11 Apr., 1985.
Kuo-Liang Chen & Shyh Wang, "Analysis of Symmetric Y-Junction Laser Arrays with Uniform Near-Field Distribution," Electron. Lett., vol. 22, No. 12, pp. 644-645, 5 Jun., 1986.

Primary Examiner—James W. Davie
Attorney, Agent, or Firm—Noel F. Heal; Sol L. Goldstein

[57]     ABSTRACT

A semiconductor laser array that discriminates in favor of a fundamental array mode of oscillation and provides a far-field radiation pattern that is single lobed and diffraction-limited. The array includes a first set of parallel waveguides, a wide-waveguide section and a second set of parallel waveguides. Oscillation in the fundamental or 0°-phase-shift array mode is easily coupled from the first set of waveguides to the wide-waveguide section, and from the wide-waveguide section to the second set of waveguides. When adjacent waveguides oscillate out of phase, as in the 180°-phase-shift array mode, easy coupling is not obtained because the waveguides of the second set are not colinear with those of the first set. The structure of the invention also avoids the large radiation losses inherent in Y-junction arrays.

10 Claims, 2 Drawing Sheets

U.S. Patent    Jul. 25, 1989    Sheet 1 of 2    4,852,113
FIG. 1a (PRIOR ART)
ARRAY MODES
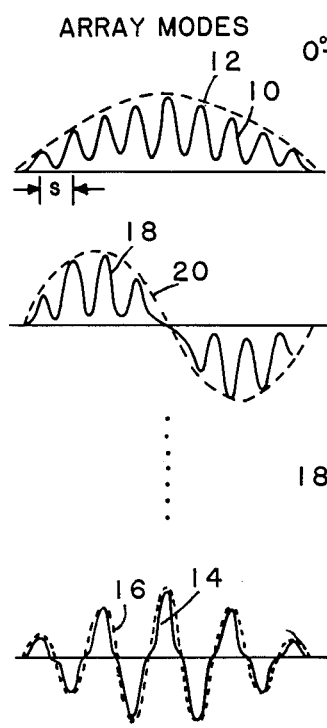
FIG. 1b (PRIOR ART)
FAR-FIELD PATTERNS
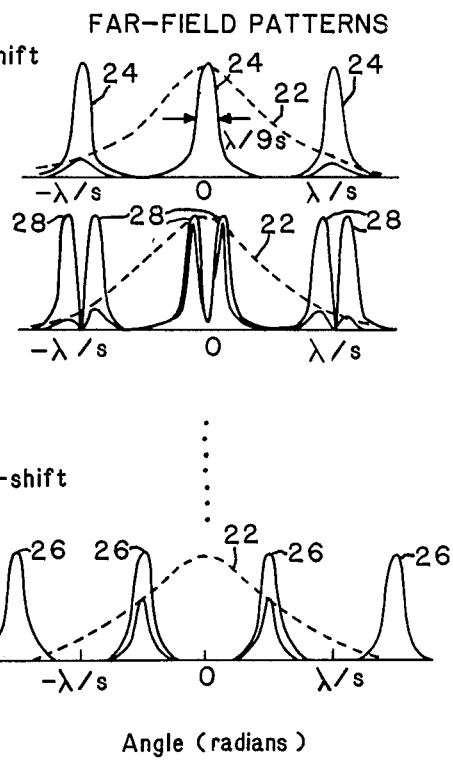
Angle (radians)
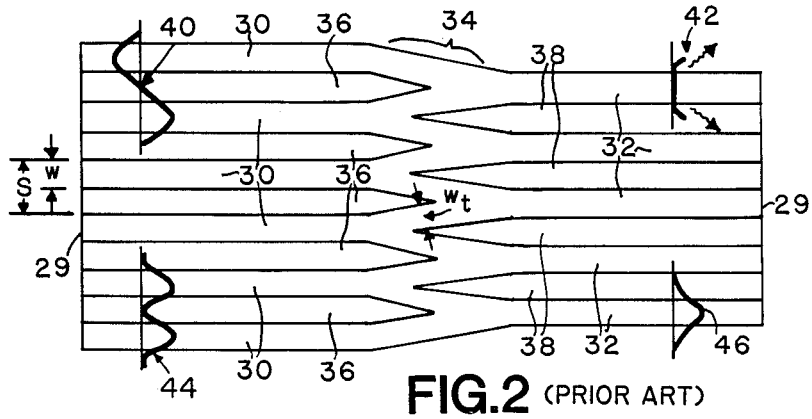
FIG. 2 (PRIOR ART)

LASER ARRAY WITH WIDE-WAVEGUIDE COUPLING REGION

BACKGROUND OF THE INVENTION

This invention relates generally to semiconductor lasers and, more particularly, to arrays of semiconductor lasers fabricated as single structures. There are a number of applications of semiconductor lasers that require relatively high output powers, such as space communications, laser printing, and optical recording. In recent years, much of the development effort in semiconductor lasers has been directed to increasing the power output from lasers in continuous wave (cw) operation, both for single laser structures and for phase-locked arrays of multiple lasers.

By way of general background, a semiconductor laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes recombine in the region of the active layer, and light is emitted. The layers on each side of the active layer have a lower index of refraction than the active layer, and function as cladding layers in a dielectric waveguide that confines the light in a direction perpendicular to the layers. Various techniques are used to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in a direction generally perpendicular to the emitting facet.

Various approaches have been used to confine the light in a lateral sense within a semiconductor laser, i.e. perpendicular to the direction of the emitted light and within the plane of the active layer. If a narrow electrical contact is employed to supply current to the device, the lasing action will be limited to a correspondingly narrow region, in a process generally referred to as "gain guiding." At high powers, gain-guided devices have strong instabilities and produce highly astigmatic, double-peaked beams. For most high-power semiconductor laser applications there is also a requirement for a diffraction-limited beam, i.e. one whose spatial spread is limited only by the diffraction of light, to a value roughly proportional to the wavelength of the emitted light divided by the width of the emitting source. Because of the requirement for a diffraction-limited beam, most research in the area has been directed to index-guided lasers. In these, various geometries are employed to introduce dielectric waveguide structures for confining the laser light in a lateral sense, i.e. perpendicular to the direction of light emission and generally in the same plane as the active layer.

A useful introduction to these and other considerations in the design of semiconductor lasers can be found in a paper by Dan Botez, entitled "Laser diodes are power-packed," IEEE Spectrum, June, 1985, pp. 43–53.

Early attempts to combine semiconductor lasers into one structure used gain-guiding to confine the light laterally, but these were sensitive to changes in drive current and other conditions. With the development of more reliable and precise crystal growth technologies, such as metal-organic vapor-phase epitaxial (MOVPE) growth, there was increased activity in the development of index-guided phase-locked arrays, some of which were capable of achieving hundreds of milliwatts of output power. More recently, the focus of attention in this area has been on developing structures that assure fundamental-array-mode operation and provide a single-lobed far-field light distribution pattern.

In general, an array of laser emitters can oscillate in one or more of multiple possible configurations, known as array modes. In the most desirable array mode, all of the emitters oscillate in phase. This is known as the 0°-phase-shift array mode, and it produces a far-field pattern in which most of the energy is concentrated in a single lobe whose width is limited, ideally, only by the diffraction of light. The least desirable array mode is obtained when adjacent laser emitters are 180° out of phase. This is the 180°-phase-shift array mode, and it produces two relatively widely spaced lobes in the far-field distribution pattern. Multiple additional modes exist between these two extremes, depending on the phase alignment of the separate emitters. Most laser arrays operate in two or three array modes simultaneously and produce one or more beams that are typically two or three times wider than the diffraction limit.

In recent years, the most promising array structure for producing a diffraction-limited beam in the fundamental array mode involves the use of Y-junction arrays, the principle of which was apparently first described in a paper by K. L. Chen and S. Wang, entitled "Single-Mode Symmetric Coupled Laser Arrays," Electron. Lett., vol. 21, no. 8, pp. 347–49, April, 1985. Basically, the Y-junction array employs a configuration of waveguides that converge in pairs at Y junctions. The principle of operation is that the 180°-phase-shift mode will couple only very poorly into a converging Y section, but the 0°-phase-shift mode will couple easily. Thus the structure discriminates against the 180°-phase-shift mode, and favors the production of a diffraction-limited beam.

Although the Y-junction structure favors the 0°-phase-shift mode of operation, with a main far-field lobe centered at a zero position, use of the Y-junction structure does not necessarily ensure that sidelobes will be insignificant in intensity; and, due to power splitting at each Y-junction, the structure suffers from radiation losses. Accordingly, there is still need for improvement in the development of alternate approaches to the achievement of single-lobed, diffraction-limited output beams from laser arrays. The present invention addresses this need.

SUMMARY OF THE INVENTION

The present invention resides in a laser array structure providing further improved performance in comparison to the Y-junction array, and in particular having a far-field pattern that is basically a single lobe with a diffraction-limited beam width. Basically, and in general terms, the structure of the invention comprises a first set of parallel waveguides coupled to one end of a wide-waveguide section, and a second set of parallel waveguides coupled to the other end of the wide-waveguide section. The array structure also includes a pair of opposed facets formed on the first and second sets of waveguides, to promote lasing within the structure. Light is emitted from both facets.

The individual waveguides in one set are not colinear with the waveguides in the other set. In the presently preferred embodiment of the invention, each of the two sets of waveguides has uniform individual waveguide widths and inter-waveguide spacings at a given transverse line through the waveguides, but each set of waveguides has two regions: a constant-width region in which the individual waveguides have parallel longitudinal axes and parallel sides, and a tapered-waveguide region in which the longitudinal axes remain parallel but the individual waveguide widths are tapered gradually until the individual waveguides meet at the wide-waveguide section.

The wide-waveguide section will support oscillation in many different modes, and both the 0°-phase-shift array mode and the 180°-phase-shift array mode will couple easily from either one of the sets of waveguide sections into the wide-waveguide section. However, coupling of the 180°-phase-shift array mode from one set of waveguides to the other, through the wide-waveguide section, is rendered difficult by the non-alignment of the two sets of waveguides.

An important advantage of the invention is that, at the emitting facet, the individual waveguide width can be larger than fifty percent of the periodic spacing of the waveguides at the emitting facet of the array, to ensure that a substantially single-lobed, diffraction-limited beam will be produced, with negligible side-lobes.

Another advantage of the invention is that it avoids the large radiation losses that occur in Y-junction arrays.

It will be appreciated from the foregoing that the present invention represents a significant advance in the field of semiconductor laser arrays. In particular, the invention provides a structure that not only discriminates against the 180°-phase-shift array mode, but also produces an output beam that is more nearly single-lobed and diffraction-limited than beams produced by previously available arrays. Other aspects and advantages of the present invention will become apparent from the following more detailed description, taken in conjunction with the accompanying drawings.

BRIEF DESCRIPTION OF THE DRAWINGS

FIGS. 1a and 1b compare the array modes and corresponding far-field patterns for a typical nine-element laser array;

FIG. 2 is a diagrammatic plan view of a Y-junction waveguide array of the prior art, configured to favor the oscillation in the 0°-phase-shift array mode;

DESCRIPTION OF THE PREFERRED EMBODIMENT

Figure 3:
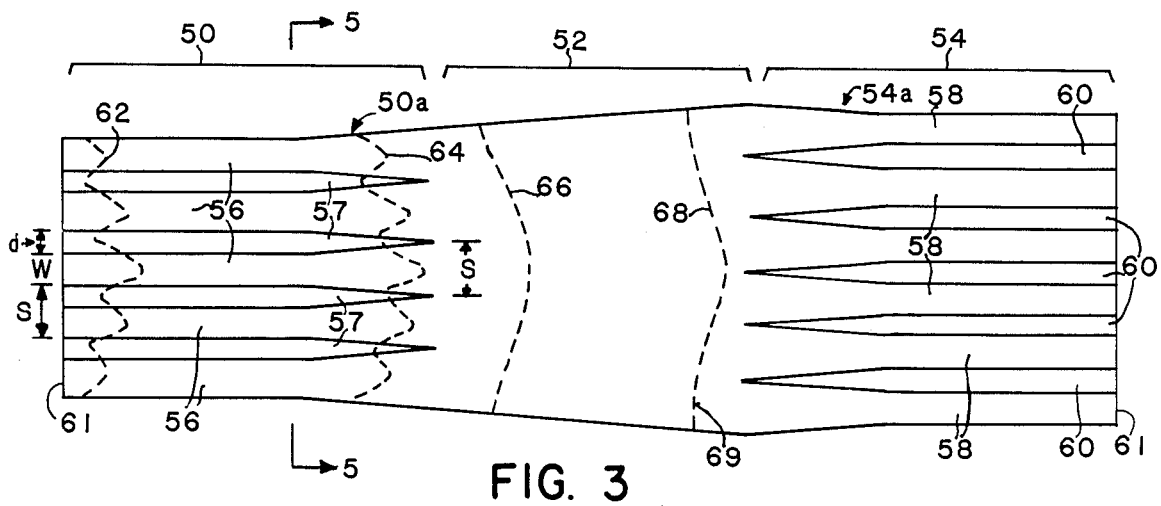
FIG. 3 is a diagrammatic plan view of a waveguide structure in accordance with the present invention, showing the intensity profiles for 0°-phase-shift mode, at various stages of the structure.

As shown in the drawings for purposes of illustration, the present invention is concerned with semiconductor laser arrays. Prior to this invention, one of the most promising approaches for achieving operation in the 0°-phase-shift array mode has been to use Y-junction arrays, but even these do not easily achieve a single-lobed far-field pattern limited in width only by the diffraction of light.

FIG. 1a illustrates three array modes of operation of a nine-emitter laser array. The first mode illustrated is the 0°-phase-shift array mode, in which all of the array elements oscillate in phase, as shown by the solid curve, indicated by reference numeral 10. The dashed curve 12 drawn as an envelope around the array modes 10, represents the resonant mode of a single waveguide having the same size as the array. The lower pattern in FIG. 1a represents the same information for the 180°-phase-shift array mode. Adjacent elements are 180° out of phase with each other, as indicated by the curves 14 and 16. Between these two extreme modes are other more complex modes of operation, one of which is illustrated by the curves 18 and 20. In general, there are as many array modes of operation as there are elements in the array.

The far-field patterns corresponding to the illustrated array modes are shown in FIG. 1b. The far-field pattern can be derived from basic diffraction theory, and results from the interference of the multiple patterns. As shown for the 0°-phase-shift case, the far-field pattern obtained if only one element is in operation is a wide beam, indicated by the dashed line 22. The solid curve 24 represents the interference pattern that would be obtained if each element were a point source. The shaded areas beneath the curve 24 represent the actual intensity pattern obtained for the 0°-phase-shift case. The pattern includes a strong central lobe and two side lobes. The curve 26 and the corresponding shaded areas beneath it illustrate the far-field pattern for the 180°-phase-shift case. The pattern is double-lobed and the least desirable for most purposes. The other array modes provide intermediate far-field patterns, as indicated by the curve 28 and the shaded areas beneath it.

It will be appreciated from FIGS. 1a and 1b that the most desirable array mode is the fundamental or 0°-phase-shift mode. It provides the most nearly single-lobed far-field pattern, and comes closest to providing a diffraction-limited beam. When the width of the beam emitted from the array is limited only by diffraction effects, the angular beam width at the half-power intensity level is determined by the wavelength divided by the array width. For an N-element array having an inter-element spacing of S, the ideal diffraction-limited beam width when operating at wavelength $\lambda$ is approximately $\lambda/NS$.

FIG. 2 shows a prior-art Y-junction array that has been demonstrated to provide discrimination against the 180°-phase-shift mode. FIG. 2 represents a plan view of a waveguide structure included within a semiconductor laser array. Electrical current flows through the array in a direction perpendicular to the plane of the figure, and lasing takes place in a cavity defined in part by reflective facets 29 located at opposite ends of the structure. The Y-junction structure includes a set of six parallel waveguides 30 that are coupled to a set of five parallel waveguides 32 in a transition region 34. The first set of waveguides 30 is defined in part by a set of five inter-waveguide regions 36 that separate the waveguides. These inter-waveguide regions 36 are tapered to a practically zero width in the transition region 34. Similarly, the second set of waveguides 32 is defined in part by a set of four inter-waveguide regions 38 that separate the waveguides. The inter-waveguide regions 38 also taper to a practically zero width in the transition region. The inter-waveguide regions 36 are aligned with the centers of the waveguides 32, and the inter-waveguide regions 38 are aligned with the centers of the waveguides 30. Moreover, the tapered end portions of the inter-waveguide regions 36 overlap the tapered end portions of the inter-waveguide regions 38, in such a manner that the energy propagating along any of the waveguides 30, except the two outer ones, is subject to bifurcation at the pointed end of one of the inter-waveguide regions 38.

Further downstream in the transition region 34, each of the waveguides 32 receives energy from two adjacent ones of the waveguides 30. If two adjacent waveguides 30 are oscillating in an out-of-phase relationship, these two oscillations will effectively cancel in the waveguide 32 to which both of the waveguides 30 contribute energy. This is shown diagrammatically in FIG. 2. Part of the out-of-phase array mode is shown at 40, in two adjacent waveguides 30. At the Y junction, these oscillations effectively cancel in a lossy mode of oscillation indicated at 42, and there is radiative loss to the inter-waveguide regions 38. By way of contrast, if two adjacent waveguides 30 are oscillating in phase, as indicated at 44, these oscillations will combine in the waveguide 32 to which both of the adjacent waveguides contribute, as indicated at 46. In other words, the Y-junction structure favors the coupling of the 0°-phase-shift array mode and discriminates against the coupling of the 180°-phase-shift array mode.

One shortcoming of this prior-art Y-junction array is that, even for the 0°-phase-shift array mode, there is inherently always a radiation loss at each point in the array at which energy is split into two adjacent paths. For example, at the point where the second waveguide 30 from the top of the figure is bifurcated by the pointed end of the first inter-waveguide region 38 from the top of the figure, there will be radiative loss to the substrate on which the structure is formed. This loss, which is caused primarily by necessarily abrupt changes in waveguide cross section at a Y junction, is well known to those familiar with waveguide structures.

Another shortcoming of the Y-junction array is that, in spite of its favorable mode discrimination, the resulting far-field pattern is not ideal. The pattern is similar to that shown at the top of FIG. 1b. There are still side lobes of significant intensity and the beam width is not diffraction-limited.

In accordance with the invention, a novel waveguide structure provides the same mode discrimination provided by a Y-junction array, but the far-field pattern more closely approaches the desired single central lobe having a diffraction-limited width. The invention permits better suppression of the undesirable sidelobes than is possible with the prior-art Y-junction array. The invention also minimizes radiative losses in the transitions between waveguide sections.

To understand how the simple waveguide structure of the invention achieves these goals it is first necessary to appreciate the limitations of the Y-junction array. As is apparent from FIG. 1b, the height of the sidelobes of the far-field pattern is dependent in part on the far-field pattern of an individual element, which is itself dependent on the near-field intensity profile of an individual element. It can be shown that the intensity of the sidelobes relative to the main lobe is dependent on the width of the emitting waveguides in relation to their periodic spacing. More specifically, the relative intensity of the sidelobes can be reduced by increasing the ratio w/S, where w is the width of the individual waveguides at the emitting facet of the structure, and S is the periodic spacing of the waveguides. For Y-junction arrays, however, the ratio w/S is limited to a value less than 0.5, as will now be discussed.

Proper operation of the prior-art Y-junction structure shown in FIG. 2 requires the width of each waveguide element in the transition region 34 to match the width of the adjoining waveguide elements on either side of the transition region. Specifically, the width $w_t$ (see FIG. 2) of the waveguide section bounded by two opposing, overlapping interwaveguide elements 36 and 38 must equal the width w of waveguide sections 30 and 32 on either side of the transition region 34. Simple consideration of the geometry shows that $w_t$ can be made equal to w only if the waveguide width w is less than or equal to one-half the periodic spacing S of the waveguides, i.e., only if $w \leq 0.5$ S. If the waveguide width w were increased to greater than 50 percent of the spacing S, the width $w_t$ of the waveguides in the transition region 34 would have to be less than w, which would create an undesirable impedance mismatch in the Y-junction. Thus, it is impossible to obtain a ratio w/S of greater than 50 percent in a Y-junction array.

In contrast, the structure of the invention includes three waveguide sections 50, 52 and 54. The first waveguide section 50 has a plurality of parallel waveguides 56, and includes a transition section 50a in which the waveguides 56 become progressively wider until they merge as one into the second waveguide section 52, which is a single wide waveguide. The waveguides 56 are defined in part by inter-waveguide regions 57, which are tapered to a negligible width at the transition to the wide-waveguide section 52. The third waveguide section 54 also includes a plurality of parallel waveguides 58, which become progressively wider in a transition section 54a, merging as one into the centrally positioned wide-waveguide section 52. The waveguides 58 are defined in part by inter-waveguide regions 60, which are tapered to a negligible width at the transition to the wide-waveguide section. The waveguides 58 have the same uniform spacing as the waveguides 56, but are not aligned with the waveguides 56. Preferably, the waveguides 58 are aligned with the inter-waveguide regions 57 between the waveguides 56. For symmetry, the number of waveguides 58 is one greater than the number of waveguides 56. The structure also includes opposed reflective end facets 61, from which light is repeatedly reflected to promote lasing within the structure. Light is ultimately emitted from one of the end facets 61 in a direction perpendicular to the facet.

When all of the waveguides 56 are excited in phase, in the 0°-phase-shift array mode, the resultant mode of oscillation is shown at 62, and again at 64 at the transition with the wide-waveguide section 52. This mode couples easily to the wide-waveguide section 52, because its amplitude and phase variations closely match those of the wide-waveguide section, as indicated by the correspondence between the fundamental array mode, as indicated at 64, and the fundamental mode of the wide-waveguide section, indicated at 66. The fundamental mode of oscillation in the opposite end of the wide-waveguide section 52 is shown at 68. At the transition from the wide-waveguide section 52 to the third waveguide section 54, there is again a relatively strong coupling and the 0°-phase-shift array mode is induced in the third waveguide section 54, as indicated at 69.

Figure 4:
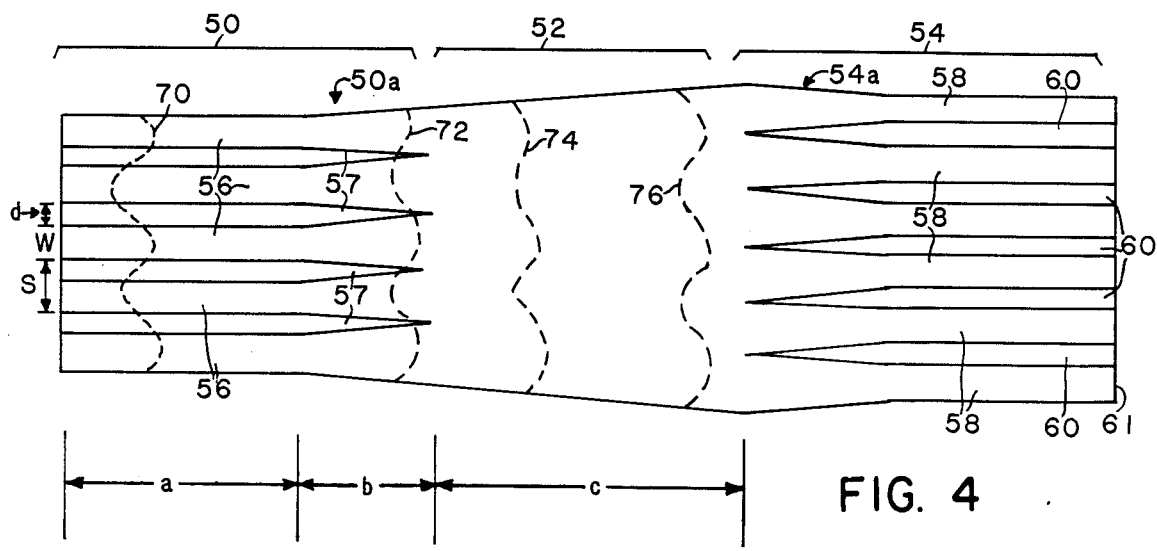
FIG. 4 is a view similar to FIG. 3, but showing the intensity profiles for the 180°-phase-shift mode of operation.

FIG. 4 shows the same structure as FIG. 3, but with the first waveguide section 50 excited in the 180°-phase-shift array mode, i.e. with adjacent waveguides 56 out of phase with each other. The mode is shown graphically at 70 and 72. Since the wide-waveguide section 52 has many possible modes of oscillation, there is still good coupling of the out-of-phase array mode to the wide-waveguide section mode, as shown at 74. However, the coupling of the wide-waveguide mode at 76 to the third waveguide section 54 is very weak, because the physical positions of the waveguides 58 are not aligned with the modes derived from the positions of the waveguides 56 in the first waveguide section 50. Therefore, the configuration discriminates strongly against the 180°-phase-shift array mode and favors the 0°-phase-shift array mode.

Most importantly, this mode discrimination is not limited by geometrical constraints within the array, and values w/S in excess of fifty percent can easily be attained. The result is that not only is the fundamental mode favored, but the far-field pattern is predominantly single-lobed and diffraction-limited. Moreover, because the structure of the invention provides for relatively smooth changes in the waveguide mode profile across the entire device, it is not susceptible to radiation losses such as those encountered in the Y-junction array. It will be recalled that, in the Y-junction array, the relatively abrupt changes in waveguide mode profile at each junction result in significant radiative losses.

Figure 5:
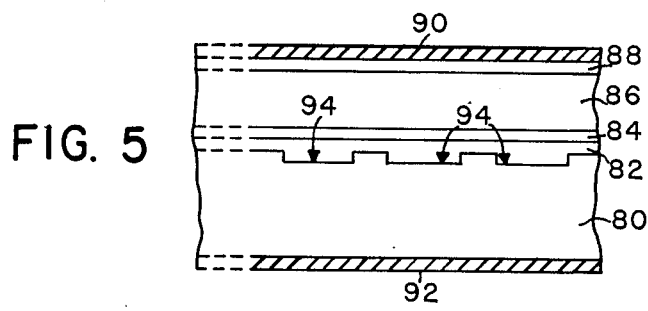
FIG. 5 is a fragmentary sectional view taken substantially along the line 5—5 in FIG. 3.

The specific structure employed to implement the invention is not particularly critical. The structure may be of the rib-waveguide, ridge-waveguide, or buried-ridge-waveguide configurations. For example, FIG. 5 shows a rib-waveguide structure, including a substrate 80, on which is formed a guide layer 82, an active layer 84, a cladding layer 86, a capping layer 88 and a metal contact layer 90. Electrical contact is made with the layer 90 and with another metal layer 92 on the underside of the substrate 80. The guide layer 82 beneath the active layer 84 forms a large optical cavity, and lasing spots are located over channels 94 in the substrate 80. As the waveguide 50 is tapered toward the wide-waveguide section 52, the channels 94 become progressively wider until they merge into the single wide-waveguide section. Both aluminum gallium arsenide/gallium arsenide and indium gallium arsenide phosphide material systems could be used to fabricate the structure. For example, the substrate 80 may be of n+ type indium phosphide, the guide layer 82 of n type indium gallium arsenide phosphide, the active layer 84 of undoped indium gallium arsenide phosphide, the cladding layer of p type indium phosphide, and the capping layer of p type indium gallium arsenide phosphide. The guide layer 82 has an index of refraction between those of the active layer 84 and the substrate 80.

Exemplary waveguide dimensions in plan view are:

| | |
|---|---|
| w (waveguide width, at the facet) | 1–3 μm |
| d (spacing between waveguides) | <w (approx.) |
| a (waveguide length, before taper) | 25–50 μm |
| b (waveguide length, transition) | 100–150 μm |
| c (wide waveguide length) | 10–100 μm |

It will be appreciated from the foregoing that the present invention represents a significant advance in the field of semiconductor laser arrays. In particular, the invention provides an array that not only favors oscillation in the 0°-phase-shift array mode, but yields a far-field radiation pattern that is single-lobed and diffraction-limited. The structure of the invention also avoids the large radiation losses inherent in the Y-junction array of the prior art. It will also be appreciated that, although an embodiment of the invention has been described in detail for purposes of illustration, various modifications may be made without departing from the spirit and scope of the invention. Accordingly, the invention is not to be limited except as by the appended claims.

I claim:

1. A semiconductor laser array structure, comprising:
   means for producing lasing action in the structure, including a substrate, an active semiconductor layer, electrodes for applying a voltage across the active layer, and a pair of reflective facets, at least one of which is an emitting facet, located at opposite ends of the array structure;
   a first set of waveguides with parallel longitudinal axes;
   a second set of waveguides with parallel longitudinal axes;
   a wide-waveguide section, having first and second ends coupled to the first and second sets of waveguides, respectively, having a length sufficient to support a single lateral mode in the wide-waveguide section, and having a width at the first end approximately equal to the overall width of the first set of waveguides and a width at the second end approximately equal to the overall width of the second set of waveguides;
   and wherein the individual waveguides in one set are not colinear with the waveguides in the other set.

2. A semiconductor laser array structure as defined in claim 1, wherein:
   the two sets of waveguides in each set have substantially equal individual widths and have substantially equal periodic waveguide spacings measured at any transverse line through the waveguides of a set.

3. A semiconductor laser array structure as defined in claim 2, wherein:
   the individual waveguide width is larger than approximately fifty percent of the periodic waveguide spacing at the emitting facet, to ensure a far-field radiation pattern that is substantially single-lobed.

4. A semiconductor laser array structure as defined in claim 3, wherein:
   the first and second sets of waveguides each include a tapered region in which the individual waveguide width is progressively increased until the individual waveguides meet the wide-waveguide section.

5. A semiconductor laser array structure as defined in claim 4, wherein:
   there is one more waveguide in the second set of waveguides than in the first set of waveguides; and
   the individual waveguides in the second set are aligned with the midpoints between waveguides of the first set.

6. A semiconductor laser array structure as defined in claim 5, wherein:
   the individual waveguides are defined in part by inter-waveguide regions that are of constant width except in the tapered regions, where the inter-waveguide regions taper to a negligible width.

7. A semiconductor laser array structure, comprising:

means for producing lasing action in the structure, including a substrate, an active semiconductor layer, electrodes for applying a voltage across the active layer, and a pair of reflective facets, at least one of which is an emitting facet, located at opposite ends of the array structure;

a first set of waveguides with parallel longitudinal axes;

a second set of waveguides with parallel longitudinal axes;

a wide-waveguide section, having first and second ends coupled to the first and second sets of waveguides, respectively; having a length sufficient to support a single lateral mode in the wide-waveguide section, and having a width at the first end approximately equal to the overall width of the first set of waveguides and a width at the second end approximately equal to the overall width of the second set of waveguides;

and wherein each of the two sets of waveguides have substantially equal individual widths and substantially equal periodic spacings measured at any transverse line through the waveguides of a set, but the individual waveguide widths vary along portions of the parallel longitudinal axes, to effect transitions to and from the wide-waveguide section, and wherein the individual waveguide widths at the emitting facet are at least fifty percent of the periodic waveguide spacing, to ensure a far-field radiation pattern that is substantially single-lobed and diffraction-limited, and the individual waveguides in one set are not collinear with waveguides in the other set, to inhibit coupling of a 180-degree-phase-shift array mode from one set of waveguides to the other.

8. A semiconductor laser array structure as defined in claim 7, wherein:

the first and second sets of waveguides each include a tapered region in which the individual waveguide width is progressively increased until the individual waveguides meet the wide-waveguide section.

9. A semiconductor laser array structure as defined in claim 8, wherein:

there is one more waveguide in the second set of waveguides than in the first set; and the individual waveguides in the second set are aligned with the midpoints between waveguides of the first set.

10. A semiconductor laser array structure as defined in claim 9, wherein:

the individual waveguides are defined in part by inter-waveguide regions that are of constant width except in the tapered regions, where the interwaveguide regions taper to a negligible width.

* * * * *